(12) United States Patent
Maloney

(10) Patent No.: US 6,388,503 B1
(45) Date of Patent: May 14, 2002

(54) OUTPUT BUFFER WITH CHARGE-PUMPED NOISE CANCELLATION

(75) Inventor: Timothy J. Maloney, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/672,371

(22) Filed: Sep. 28, 2000

(51) Int. Cl.[7] ................................................ H03K 5/00
(52) U.S. Cl. ...................... 327/384; 327/390; 327/551; 327/380
(58) Field of Search ................................ 327/379, 380, 327/384, 390, 387, 388, 551

(56) References Cited

U.S. PATENT DOCUMENTS

| | | | | |
|---|---|---|---|---|
| 5,736,888 A | * | 4/1998 | Sharpe-Geisler | 327/380 |
| 5,789,964 A | * | 8/1998 | Voldman | 327/380 |
| 6,191,647 B1 | * | 2/2001 | Tanaka et al. | 327/551 |

* cited by examiner

Primary Examiner—Dinh T. Le
(74) Attorney, Agent, or Firm—Blakely, Sokoloff, Taylor & Zafman LLP (57) ABSTRACT

A circuit is provided that has an output buffer connected to one of a plurality of output pads. A power source is connected to one of the plutrality of output pads. A first pair of capacitors is connected to the power source. A second pair of capacitors is connected to the first pair of capacitors and the power source. A first pair of signal sources are connected to the first pair of capacitors. A second pair of signal sources connected to the second pair of capacitors. The first pair of signal sources and the second pair of signal sources control discharge to the power source and recharge to the power source of the first pair of capacitors and the second pair of capacitors to cancel out noise caused by either a voltage or current switching transient. Also, a method is provided for sending data to an output buffer, determining data to be clocked the next cycle, and controlling a charge-pump circuit to compensate for a voltage transition from one of high-to-low and low-to-high. The method also provides that noise resulting from a voltage transition at an output is cancelled before occuring by the charge-pump circuit.

25 Claims, 7 Drawing Sheets

OUTPUT BUFFER WITH CHARGE-PUMPED NOISE CANCELLATION

BACKGROUND OF THE INVENTION

1. Field of the Invention

This invention relates to reducing input/output (I/O) noise in integrated circuits (ICs), and more particularly to implementing a charge-pump synchronization noise cancellation method and apparatus.

2. Background Information

Traditional digital CMOS (complementary metal oxide semiconductor) or GTL (Gunning transceiver logic) I/O buffers cause considerable power supply noise upon switching by generating substantial delta current/delta time (di/dt) transients. Package inductance causes common mode noise on the common voltage (Vcc) and source voltage (Vss) lines. At the same time, a finite amount of low-pass filter capacitance from Vcc to Vss causes differential mode noise on the on-chip power supply by affecting noise margins. Process scaling and bus speed increases have led to a situation where large amounts of silicon area at each I/O slice are used for passive decoupling capacitors that are typically required to reduce noise. The additional area required for decoupling capacitors may take as much as half or more of the allocated area.

Figure 1:
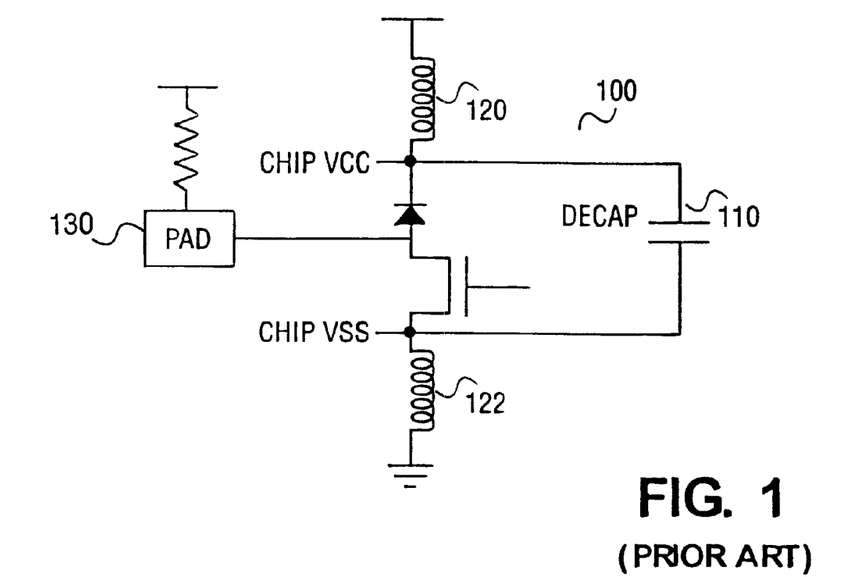
FIG. 1 illustrates a basic Gunning transceiver logic (GTL) circuit.

FIG. 1 illustrates a basic GTL circuit 100 having its output coupled to a 50 ohm bus terminated at both ends. On-chip decoupling capacitor 110, package inductance 120 and 122, and I/O pad 130 are also shown. The output circuit could be other types of circuits, such as CMOS (complementary metal oxide semiconductor), but GTL was chosen in order to simplify this example.

Figure 2:
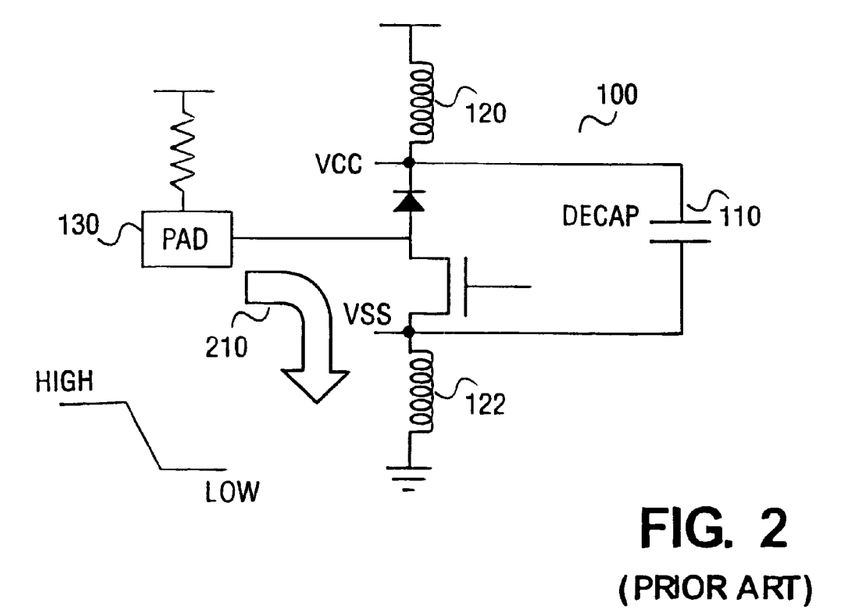
FIG. 2 illustrates the GTL circuit of FIG. 1 with a high to low transition.

Noise occurs when the output switches from high to low or from low to high. FIG. 2 shows the path that current 210 from the external supply takes when the output transitions from high to low. Current will ramp up in the inductance 122 to external Vss because of di/dt, causing a voltage drop to external Vss as well as a dip in the on-chip Vcc-to-Vss voltage. At worst, noise will occur when all outputs of a GTL bus switch at once.

Another method to reduce output noise is as follows. For every data bit transmitted, one can transmit a redundant complementary bit as well. Thus, doubling the output circuit area, power and number of external connections. This also assures low noise because of a steady current requirement. Other methods, such as coding, assure that extreme cases of large numbers of I/Os flipping from 1 to 0 or 0 to 1 do not occur.

DETAILED DESCRIPTION

The invention generally relates to a method and apparatus for reducing noise by using an active charge-pump circuit. Referring to the figures, exemplary embodiments of the invention will now be described. The exemplary embodiments are provided to illustrate the invention and should not be construed as limiting the scope of the invention.

Figure 3:
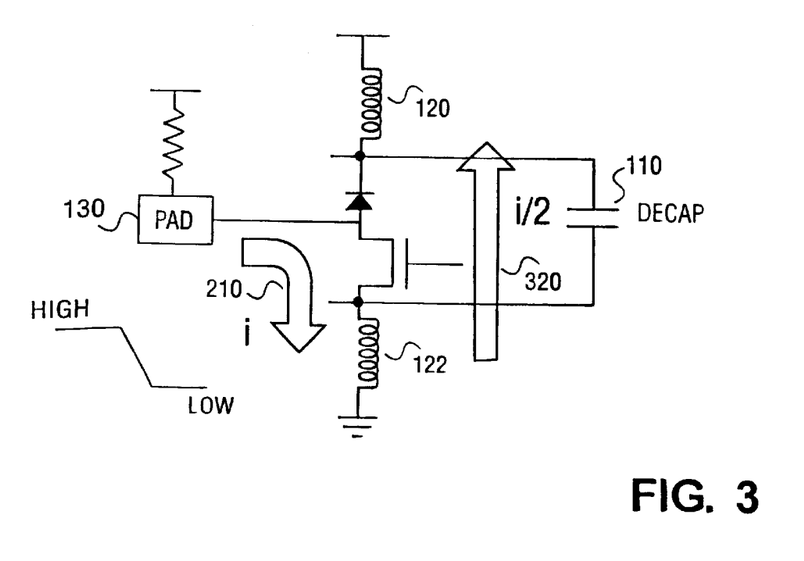
FIG. 3 illustrates a balancing current for the GTL circuit illustrated in FIG. 2.

In one embodiment of the invention, an active charge pump circuit is synchronized with known noise-creating events, such as switching from a high state to a low state, in the output buffer to cancel output noise. Since charge pump capacitors experience a larger voltage swing than passive decoupling capacitors, the use of charge pump capacitors are more efficient in cancelling output noise than decoupling capacitors and use much less chip area (approximately one third of the area). FIG. 3 illustrates balancing current i/2 320 flow direction in the circuit illustrated in FIG. 2 for a high-to-low voltage transition. The on-chip differential noise on Vss to Vcc occuring (due to di/dt) from the high-to-low transition can be cancelled out if a balancing current, i/2 320, flowing in the opposite direction of i 210 can be applied. Balancing current i/2 320 also reduces the common mode noise on Vss by one half. Current i/2 320 (di/dt) places an equal and opposite amount of common noise on Vcc, thus redistributing the common mode noise and, at the same time, cancelling the differential mode noise entirely. For ease of discussion, the Vcc and Vss inductances are considered to be equal so that i/2 320, and not an inductance weighted value, is appropriate for balancing.

Figure 4:
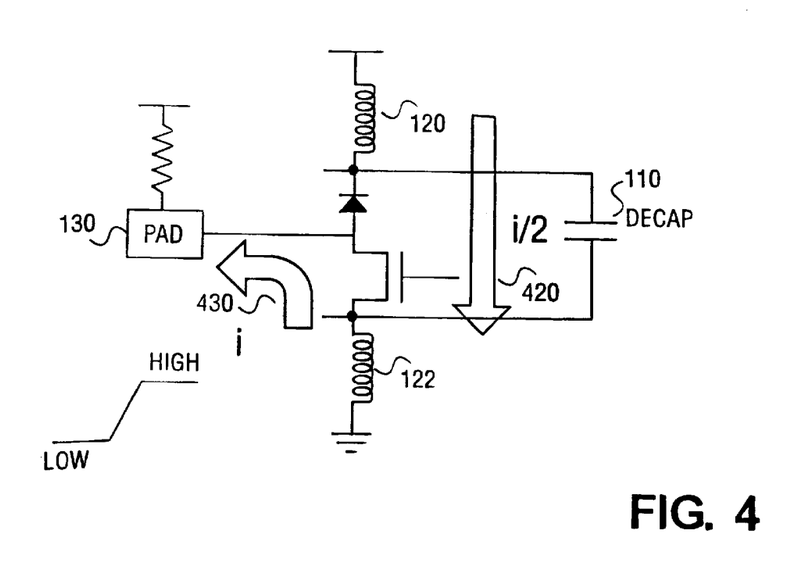
FIG. 4 illustrates the GTL circuit of FIG. 1 with a balancing current for a low to high transition.

For completeness, FIG. 4 illustrates a low-to-high voltage transient applied to the circuit illustrated in FIG. 2 and the balancing current 420. It should be noted that decoupling capacitor 110, accomplishes part of the desired flow of current opposite to the output transient, although this may be far from ideal. The current Ic across decoupling capacitor 110 is represented by the following equation:

$$Ic = C\, dVc/dt.$$

The current from passive decoupling capacitors only flows at the expense of differential voltage drop across the chip's power supplies. Therefore, decoupling capacitors can never cancel out the differential noise, but only reduce the noise with a larger and larger area devoted to the decoupling capacitor. The passive decoupling capacitor is inherently inefficient because any beneficial current flow must be associated with a voltage drop across the capacitor plates. The voltage drop corresponds to an undesired on-chip differential voltage drop between Vcc and Vss.

Many current chip sets designs, including the next generation I/O (NGIO), use massive numbers of decoupling capacitors on the I/O power supply. Often, a large area of each on-chip I/O slot is devoted to decoupling capacitors (typically 200–400 pf per output). Therefore, considerable area is devoted to power supply filtering.

Figure 5:
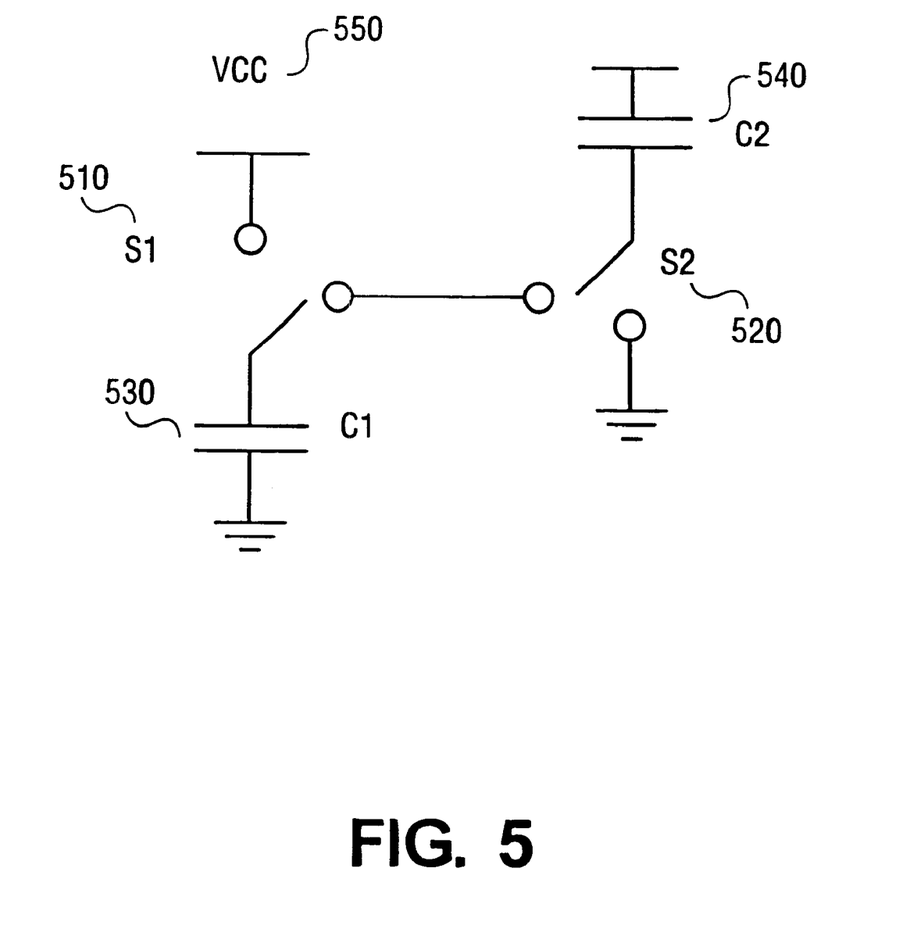
FIG. 5 illustrates a switched capacitor circuit for applying a balancing current to a power supply.

FIG. 5 illustrates an embodiment using a switched capacitor to produce the synchronized current flow necessary to balance the noise generated by output transitions. The transient balancing current is applied at a given I/O. The discharge mode, corresponding to a high-low transition and i/2 from Vss to Vcc, results when switch 510 moves from left to right, and switch 520 moves from right to left. This movement connects capacitors 530 and 540 in series. The complementary recharge event from Vcc to Vss on the capacitors occurs upon switch 510 moving from right to left, and switch 520 moving from left to right, thus connecting capacitors 530 and 540 to power supply Vcc 550 in parallel.

When the capacitance of capacitor 530 is equal to the capacitance of capacitor 540, the charge pumping cycle allows the voltages across the capacitors to swing between Vcc/2 and Vcc. Because of this large voltage swing, the resulting di/dt transients can be quite large for capacitors of a given size. Because of the advantage of larger current transients due to larger capacitive voltage swings, it is possible to cancel the output noise in a smaller area than using passive decoupling capacitors to filter the noise. Each output pad is considered as a separate unit. Therefore, the noise produced by each pad will be cancelled with separate circuitry for each pad. Thus, one skilled in the art can readily seen that the present embodiment is scaleable for output noise cancellation.

To cancel output noise using an embodiment of the invention having charge pump circuitry, local circuitry is set up to anticipate power supply noise about to be produced. Therefore, the charge pump circuitry is synchronized to cancel noise upon occurrence. When data bits are transmitted through an output buffer of a chip, the data bits are typically transmitted to a pipeline and pass through several latches and buffers. As a result, the data stream for a given output pad is several bits deep at any one time. Therefore, the data about to be clocked is known. With the knowledge of the data about to be clocked, circuits can be added to the pipeline reflecting the knowledge of the data about to reach the pad. These circuits can, therefore, anticipate the transient about to occur at the pad. One embodiment of the invention triggers the capacitive charge pump circuits to coincide with the output transients to achieve noise cancellation. Table 1 illustrates how an embodiment using charge pump circuitry reacts to a data change about to occur at the output.

TABLE 1

| $D_n$ (data, time n) | $D_{n+1}$ (data, time n + 1) | Pump Status |
| --- | --- | --- |
| 0 | 0 | Prepare for recharge |
| 1 | 0 | Discharge (FIG. 3) |
| 0 | 1 | Recharge (FIG. 4) |
| 1 | 1 | Prepare for discharge |

Figure 6:
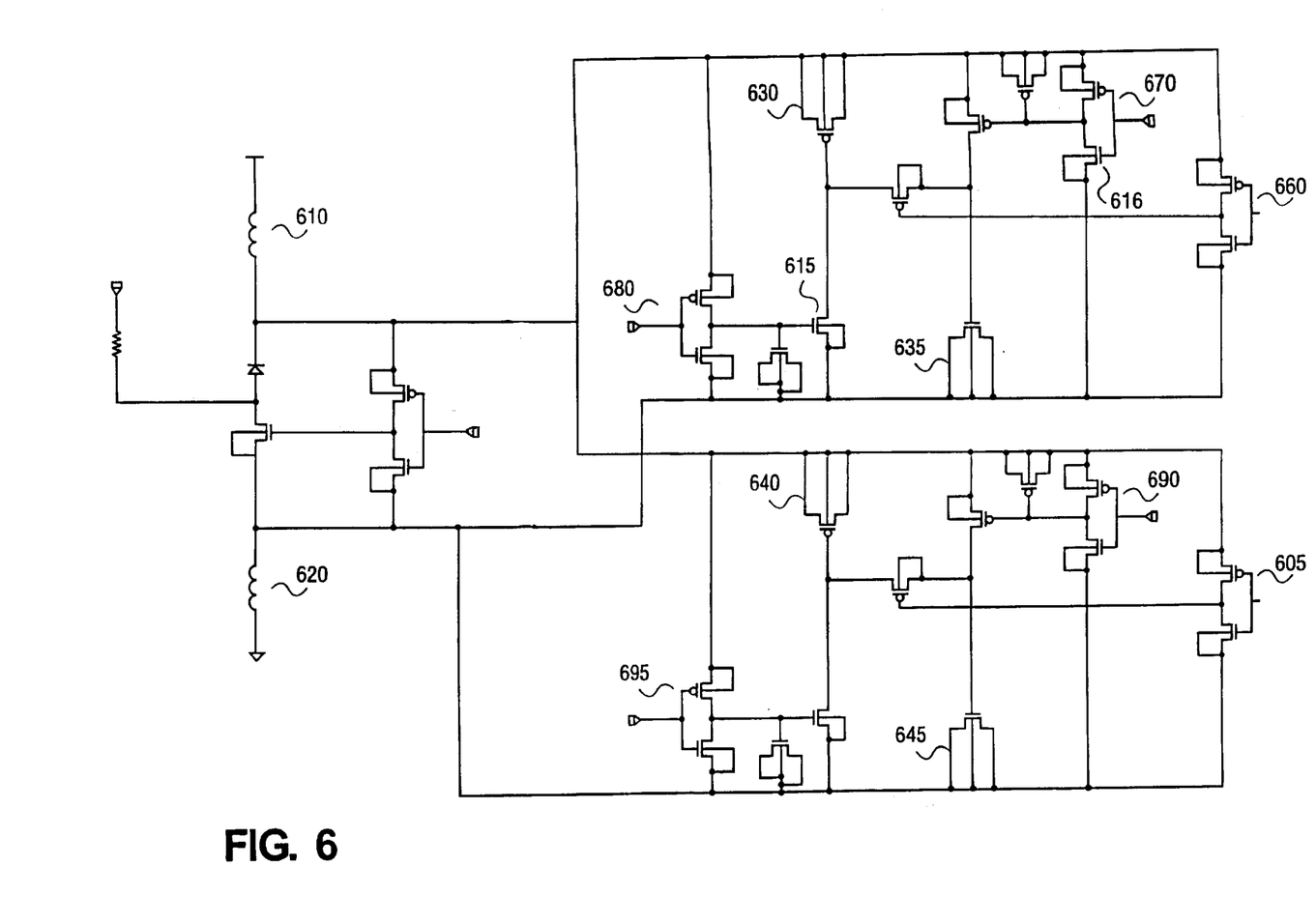
FIG. 6 illustrates an embodiment of the invention having a charge pump noise cancellation for GTL output.

FIG. 6 illustrates an embodiment of the invention using a charge pump scheme for a GTL circuit. Power supply inductances 610 and 620 may be typical values, such as 1.5 nH. There are two sets of capacitor pairs 630 and 635, 640 and 645, respectively. The capacitor pairs can can be such as enhancement type positive-channel metal oxide semiconductor (PMOS) and negative-channel metal oxide semiconductor (NMOS) capacitors. The capacitor pairs supply the discharge and recharge pulses. Partitioning into two distinct sections is done because the discharge pulse is inherently less efficient than the recharge pulse. Therefore, all of the capacitance is necessary to produce the desired discharge di/dt, and less capacitance is necessary for the recharge di/dt. Section 660, having recharge controlled by control signal 670 and control signal 680, slows recharge over available time by use of slow inverter circuits on the gate of the recharge field effect transistors (FETs) 615 and 616. One skilled in the art will note that other type of switching devices may be used other than FETs for recharge. Section 605, having recharge and discharge controlled by control signal 690 and control signal 695, balances di/dt with a faster discharge and recharge than upper section 660.

It should be noted that adding passive capacitance to an embodiment using the charge pump does not reduce noise. On the contrary, the addition of passive capacitance excites resonances.

By using an embodiment having a charge pump circuit at each output, di/dt noise can be cancelled out. The charge pump circuit is timed to source current into, or sink current from, power supplies to counteract the current necessary to switch the output either high or low. Therefore, di/dt transients are smoothed out and the output, as a unit, is less noisy. Because the charge pump acts on its capacitors in an intrinsically efficient way, with a large voltage swing (compared to passive filter capacitors), less area is required on the chip for noise reduction purposes. As an example, noise filtering by passive capacitance circuit having a value of 200 pF can be accomplished in as little as one-third of the area by using an embodiment of the present invention having a charge pump. Therefore, it is much easier to scale outputs and the associated noise reduction circuit.

Figure 7:
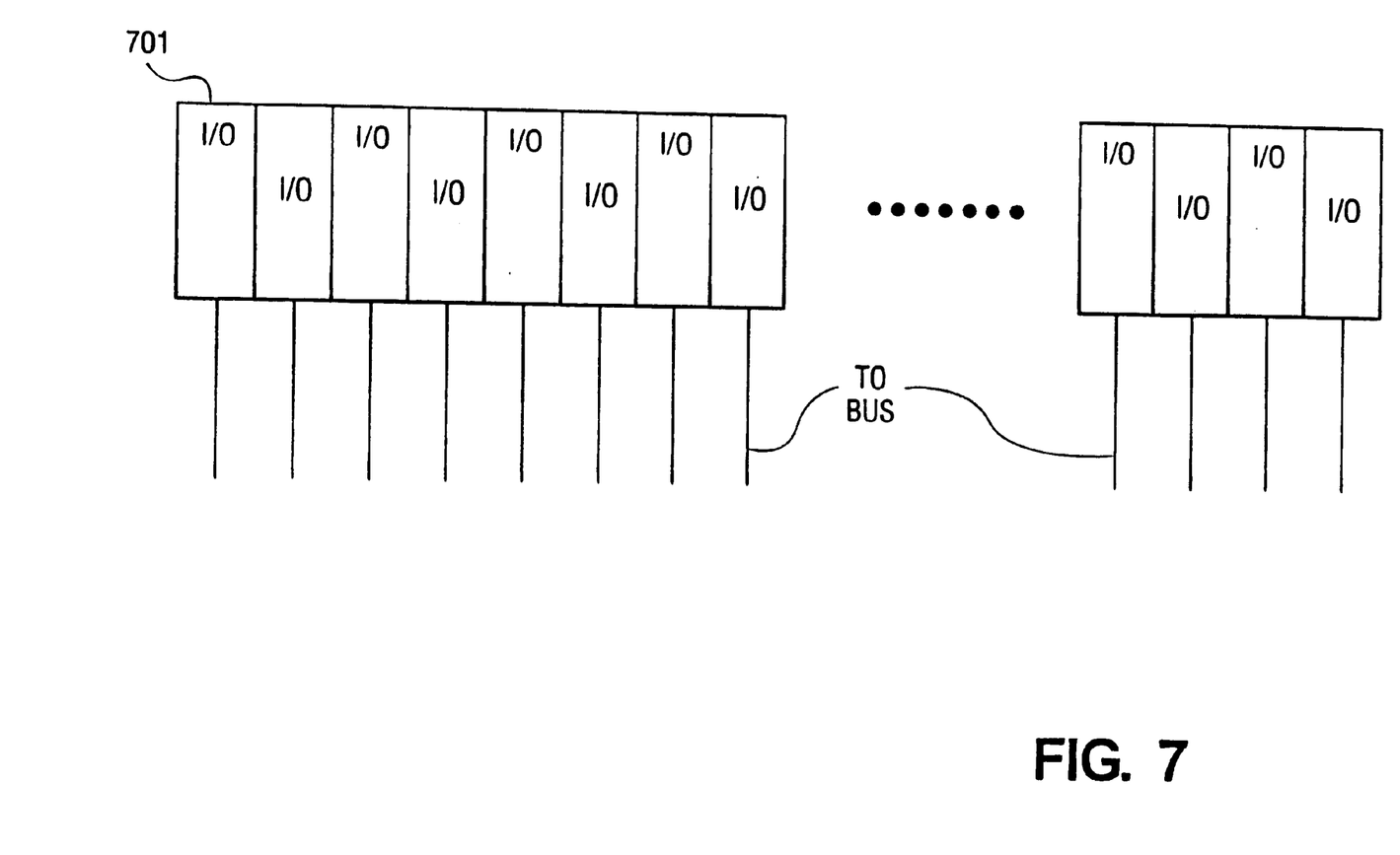
FIG. 7 illustrates a block diagram of an embodiment showing scale ability of a charge pump for noise cancellation.

FIG. 7 illustrates a basic block diagram of an embodiment containing a charged pump I/O circuit. Circuit 701 is a self contained, scaleable, bit slice unit. Circuit 701 can be used on any integrated circuit bus requiring the output of binary data. Typically, circuit 701 would be used on a microprocessor or chip set component with a data bus that communicates with memory or controller chips. One skilled in the art will recognize that circuit 701 can also interface with other components, such as dynamic random access memory (DRAM), level 2 (L2) cache, accelerated graphics port (AGP), controller hub, peripheral component interconnect (PCI), integrated drive electronics (IDE), general purpose input/output (GPIO). With the scaleable charged-pump I/O, the width of the bus (i.e. number of bits, as represented by the number of output pads, one bit per pad) does not effect performance, even if all bits switch at once. This is because each I/O unit (the bit slice) takes care of its own noise compensation. Therefore, the scaleability is readily seen. Implementation on a 64 bit or 128 bit data bus would not a noise problem when all bits switch since the noise compensation is arranged bit by bit. Also, the noise compensation is accomplished with much less area than by using passive decoupling capacitors.

Figure 8:
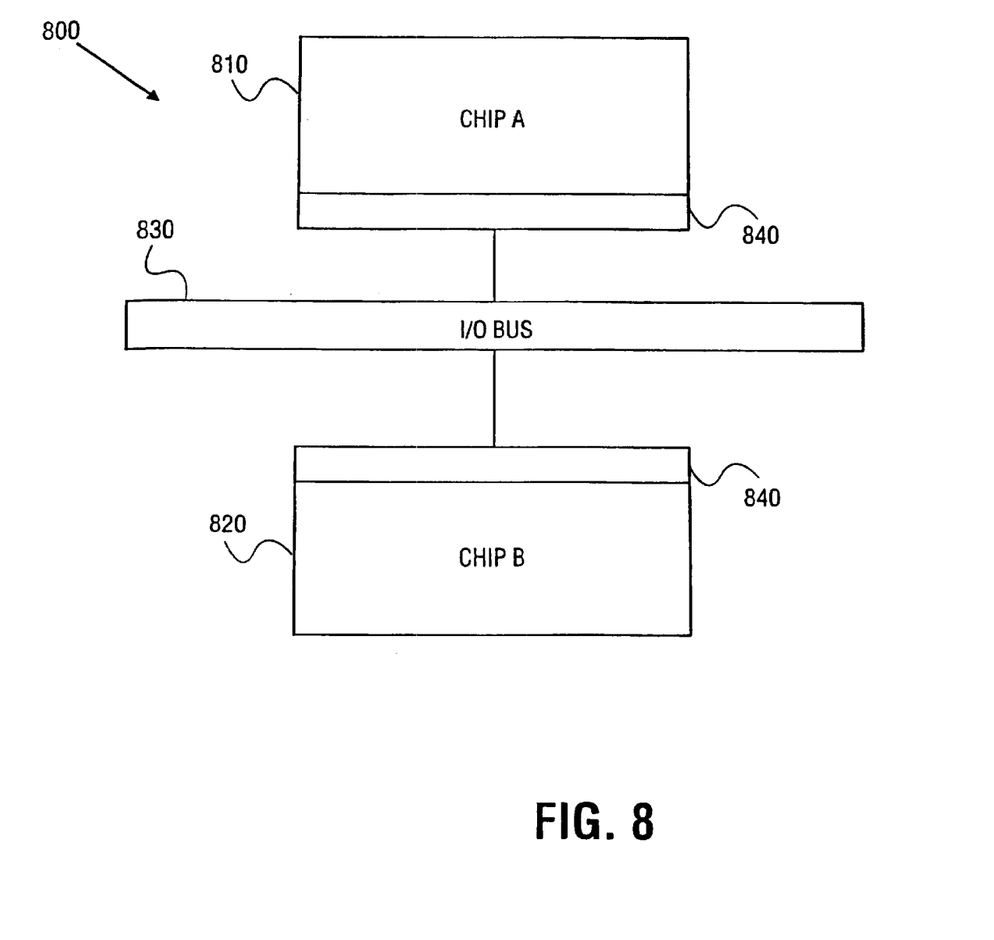
FIG. 8 illustrates an embodiment of the invention implemented in a system having multiple chips and an input/output bus.

FIG. 8 illustrates a basic system 800 including chip A 810, chip B 820, and I/O bus 830. Chip A 810 and Chip B 820 can either both have charged-pump I/O 840 implemented or only one can have charged-pump I/O 840 implemented. I/O bus 830 can be unidirectional or bidirectional. Chip A 810 and chip B 820 can be electronic components, such as the examples illustrated in Table 2.

TABLE 2

| | CHIP A 810 | CHIP B 820 |
| --- | --- | --- |
| 1 | graphics and memory controller hub (GMCH) | System memory (64 bit address) |
| 2 | GMCH | I/O controller hub |
| 3 | Microprocessor | GMCH |
| 4 | I/O controller hub PCI outputs | PCI slots |
| 5 | I/O controller hub | General purpose I/O (GPIO) |

One skilled in the art will note that the components illustrated in Table 2 under A 810 and Chip B 820 can be reversed, and that the components listed in Table 2 are not exhaustive. All of the components listed in Table 2 would have I/O bidirectional except for the first entry. In the first entry, only the GMCH would have a charge-pumped I/O, not the system memory. In this case, the system would suffer less from effects of all lines switching at once. In the other entries, a charged-pumped I/o could be implemented on either or both Chip A 810 and Chip B 820.

Transient current, di/dt, can be cancelled at each output by making use of an embodiment of the invention using a charge pump circuit at each output. The circuit is timed to source current into, or sink current from, the power supplies to counteract the current needed to switch the output high or low. Therefore, di/dt transients are smoothed out and the output, as a unit, is less noisy. Because the charge pump "exercises" its capacitors in an intrinsically efficient way, with a large voltage swing compared to passive filter capacitors, less area is required for noise reduction purposes.

Figure 9:
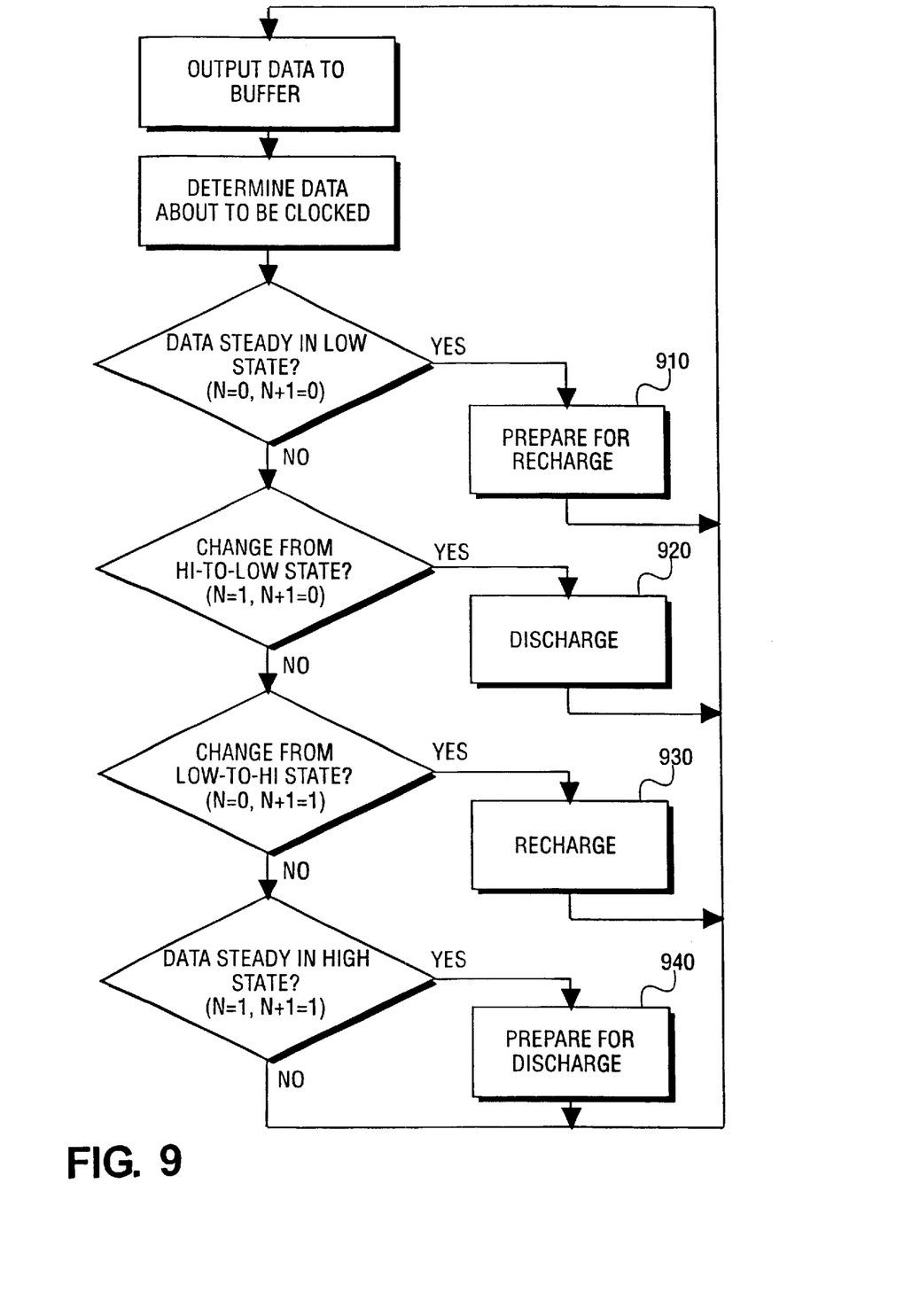
FIG. 9 illustrates a flow diagram of an embodiment timing the charge pump to the anticipated transient.

FIG. 9 illustrates a flow diagram an embodiment controlling charge pump status based on anticipated voltage transients. Pump status is either prepare for recharge 910, discharge 920, recharge 930 or prepare for discharge 940. Since the data about to be clocked is known, it can be seen that the voltage transient can be timed with the recharge or discharge of the charge pump embodiment.

The above embodiment can also be stored on a device or medium and read by a machine to perform instructions. The device or medium may include a solid state memory device and/or a rotating magnetic or optical disk. The device or medium may be distributed when partitions of instructions have been separated into different machines, such as across an interconnection of computers.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An apparatus comprising:
    an output buffer coupled to one of a plurality of output pads;
    a power source coupled to the one of the plurality of output pads;
    a first pair of capacitors coupled to the power source;
    a second pair of capacitors coupled to the first pair of capacitors and the power source;
    a first pair of signal sources coupled to the first pair of capacitors; and
    a second pair of signal sources coupled to the second pair of capacitors,
    wherein the first pair of signal sources and the second pair of signal sources control discharge and recharge of the first pair of capacitors and the second pair of capacitors to and from the power source to cancel out noise caused by one of a voltage and a current switching transient.

2. The apparatus of claim 1, wherein data representing one of the voltage switching and current switching transient is buffered before reaching one of the plurality of output pads.

3. The apparatus of claim 1, wherein the first pair of capacitors and the second pair of capacitors are one of positive-channel metal oxide semiconductor (PMOS) and negative-channel metal oxide semiconductor (NMOS).

4. The apparatus of claim 1, wherein the first pair of signal sources and the second pair of signal sources are timed to coincide with buffered data representing high-to-low transitions caused by a discharge of the first and second pair of capacitors and low-to-high voltage transitions caused by a recharge.

5. The apparatus of claim 1, wherein the first pair of signal sources and the second pair of signal sources are timed to coincide with buffered data representing current flow transitions.

6. A system comprising:
    a first chip having a first buffer coupled to a plurality of output pads;
    a second chip having a second buffer coupled to a plurality of one of input and output pads; a bus coupled to the first chip and the second chip;
    a first pair of capacitors coupled to a power source;
    a second pair of capacitors coupled to the first pair of capacitors and the power source;
    a first pair of signal sources coupled to the first pair of capacitors; and
    a second pair of signal sources coupled to the second pair of capacitors,
    wherein the first pair of signal sources and the second pair of signal sources controls discharge and recharge of the first pair of capacitors and the second pair of capacitors to and from the power source to cancel out noise caused by one of a voltage and a current switching transient in the first chip.

7. The system of claim 6, wherein the first buffer and the second buffer are one of an input buffer and an output buffer.

8. The system of claim 6, further comprising:
    a third pair of capacitors coupled to the power source;
    a fourth pair of capacitors coupled to the third pair of capacitors and the power source;
    a third pair of signal sources coupled to the third pair of capacitors; and
    a fourth pair of signal sources coupled to the fourth pair of capacitors,
    wherein the third pair of signal sources and the fourth pair of signal sources controls discharge and recharge of the third pair of capacitors and the fourth pair of capacitors to and from the power source to cancel out noise caused by one of a voltage and a current switching transient in the second chip.

9. The system of claim 6, wherein the bus is one of bidirectional and unidirectional.

10. The system of claim 6, wherein data representing one of the voltage switching and current switching transient is buffered before reaching one of the plurality of output pads of the first chip.

11. The system of claim 8, wherein data representing one of the voltage switching and current switching transient is buffered before reaching one of the plurality of output pads of the first chip.

12. The system of claim 6, wherein the first pair of capacitors and the second pair of capacitors are one of positive-channel metal oxide semiconductor (PMOS) and negative-channel metal oxide semiconductor (NMOS).

13. The system of claim 8, wherein the third pair of capacitors and the fourth pair of capacitors are one of positive-channel metal oxide semiconductor (PMOS) and negative-channel metal oxide semiconductor (NMOS).

14. The system of claim 6, wherein the first pair of signal sources and the second pair of signal sources are timed to coincide with buffered data representing high-to-low and low-to-high voltage transitions.

15. The system of claim 8, wherein the third pair of signal sources and the fourth pair of signal sources are timed to coincide with buffered data representing high-to-low and low-to-high voltage transitions.

16. The system of claim 6, wherein the first pair of signal sources and the second pair of signal sources are timed to coincide with buffered data representing current flow transitions.

17. The system of claim 8, wherein the third pair of signal sources and the fourth pair of signal sources are timed to coincide with buffered data representing current flow transitions.

18. A method comprising:

sending data to an output buffer;

determining data about to be clocked;

determining a state of the data;

determining a change of state for the data, wherein the data is one of a high state and a low state;

discharging a circuit if the change in state of the data is from the high state to the low state; and recharging the circuit if the change in state of the data is from the low state to the high state;

wherein noise resulting from the change in state is cancelled before occurring at an output by the circuit.

19. The method of claim 18, wherein determining the state further comprises:

determining whether current data and next data are in the low state;

preparing the circuit for recharge from a power source if the current data and the next data are in the low state;

determining whether a change from the current data to the next data is a high-to-low transition;

discharging the circuit to the power source if a change from current data to next data is a high-to-low transition;

determining whether a change from the current data to the next data is a low-to-high transition;

recharging the circuit from the power source to cancel noise that resulted from a transient caused by the low-to-high transition if a transition by the current data to the next data is a low-to-high transition;

determining whether the current data and the next data are in the high state; and preparing the circuit for discharge to the power source if the current data and the next data are in the high state.

20. The method of claim 19, wherein discharging the circuit is synchronized with a transient about to occur at an output pad that is caused by change of the current data to the next data is a high-to-low transition.

21. The method of claim 19, wherein recharging the charge-pump circuit is synchronized with a transient about to occur at an output pad that is caused by change of the current data to the next data is a low-to-high transition.

22. An apparatus comprising a machine-readable medium containing instructions which, when executed by a machine, cause the machine to perform operations comprising:

sending data to an output buffer;

determining data about to be clocked;

determining a state of the data;

determining a change of state for the data, wherein the data is one of a high state and a low state;

discharging a circuit if the change in state of the data is from the high state to the low state; and recharging the circuit if the change in state of the data is from the low state to the high state;

wherein noise resulting from the change in state is cancelled before occurring at an output by the circuit.

23. The apparatus of claim 22, further containing instructions which, when executed by the machine, cause the machine to perform operations including:

determining whether current data and next data are in the low state;

preparing the circuit for recharge from a power source if the current data and the next data are in the low state;

determining whether a change from the current data to the next data is a high-to-low transition;

discharging the circuit to the power source if a change from current data to next data is a high-to-low transition;

determining whether a change from the current data to the next data is a low-to-high transition;

recharging the circuit from the power source to cancel noise that resulted from a transient caused by the low-to-high transition if a transition by the current data to the next data is a low-to-high transition;

determining whether the current data and the next data are in the high state; and preparing the circuit for discharge to the power source if the current data and the next data are in the high state.

24. The apparatus of claim 23, wherein discharging the circuit is synchronized with a transient about to occur at an output pad that is caused by change of the current data to the next data is a high-to-low transition.

25. The apparatus of claim 23, wherein recharging the charge-pump circuit is synchronized with a transient about to occur at an output pad that is caused by change of the current data to the next data is a low-to-high transition.

* * * * *

UNITED STATES PATENT AND TRADEMARK OFFICE
CERTIFICATE OF CORRECTION

PATENT NO. : 6,388,503 B1
DATED : May 14, 2002
INVENTOR(S) : Maloney

It is certified that error appears in the above-identified patent and that said Letters Patent is hereby corrected as shown below:

Column 4,
Line 39, after "would not", insert -- have --.
Line 63, after "under", insert -- Chip --.

Column 5,
Line 3, delete "I/o", insert -- I/O --.

Signed and Sealed this

Seventeenth Day of September, 2002

Attest:

JAMES E. ROGAN
Attesting Officer  Director of the United States Patent and Trademark Office